United States Patent
Abadeer et al.

(10) Patent No.: US 7,939,395 B2
(45) Date of Patent: May 10, 2011

(54) HIGH-VOLTAGE SOI MOS DEVICE STRUCTURE AND METHOD OF FABRICATION

(75) Inventors: Wagdi W. Abadeer, Essex Junction, VT (US); Lillian Kamal, legal representative, Saratoga, CA (US); Kiran V. Chatty, Essex Junction, VT (US); Robert J. Gauthier, Jr., Essex Junction, VT (US); Jed H. Rankin, Essex Junction, VT (US); Yun Shi, Essex Junction, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/465,857

(22) Filed: May 14, 2009

(65) Prior Publication Data

US 2010/0289079 A1    Nov. 18, 2010

(51) Int. Cl.
*H01L 21/336* (2006.01)
(52) U.S. Cl. ........... 438/196; 438/195; 257/E21.119; 257/E21.283; 257/354; 257/353
(58) Field of Classification Search .......... 438/196, 438/195, 423, 517; 257/E21.119, E21.12, 257/E21.283, E21.564, E21.638, E21.561, 257/E21.683, E21.623, 353, 354, E27.423, 257/E27.014, E27.046, E27.059
See application file for complete search history.

(56) References Cited

U.S. PATENT DOCUMENTS

| | | | | |
|---|---|---|---|---|
| 6,100,567 A * | 8/2000 | Burr | ............... | 257/365 |
| 6,346,446 B1 * | 2/2002 | Ritenour | ............... | 438/283 |
| 6,383,904 B1 * | 5/2002 | Yu | ............... | 438/589 |
| 6,759,282 B2 * | 7/2004 | Campbell et al. | ............... | 438/149 |
| 6,972,448 B2 * | 12/2005 | Houston | ............... | 257/270 |
| 7,105,897 B2 * | 9/2006 | Chen et al. | ............... | 257/347 |
| 7,230,270 B2 * | 6/2007 | Chen et al. | ............... | 257/67 |
| 7,268,046 B2 | 9/2007 | Letavic et al. | | |
| 7,320,918 B2 | 1/2008 | Campbell et al. | | |
| 7,446,350 B2 * | 11/2008 | Chen et al. | ............... | 257/190 |
| 7,491,588 B2 * | 2/2009 | Campbell et al. | ............... | 438/149 |
| 7,675,117 B2 * | 3/2010 | Atanackovic | ............... | 257/366 |
| 2002/0086465 A1 * | 7/2002 | Houston | ............... | 438/149 |
| 2005/0158933 A1 * | 7/2005 | Inoh | ............... | 438/197 |
| 2007/0120200 A1 * | 5/2007 | Yun | ............... | 257/401 |

* cited by examiner

*Primary Examiner* — Caridad M Everhart
(74) *Attorney, Agent, or Firm* — Richard Kotulak; Roberts Mlotkowski Safran & Cole, P.C.

(57) ABSTRACT

Structures and methods for integrating a thick oxide high-voltage metal-oxide-semiconductor (MOS) device into a thin oxide silicon-on-insulator (SOI). A method of forming a semiconductor structure includes forming first source and drain regions of a first device below a buried oxide layer of a silicon-on-insulator (SOI) wafer, forming a gate of the first device in a layer of semiconductor material above the buried oxide layer; and forming second source and drain regions of a second device in the layer of semiconductor material above the buried oxide layer.

20 Claims, 7 Drawing Sheets

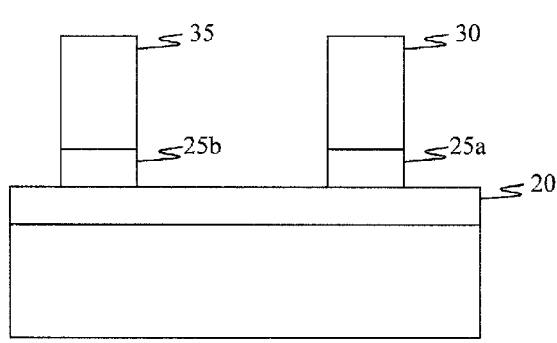
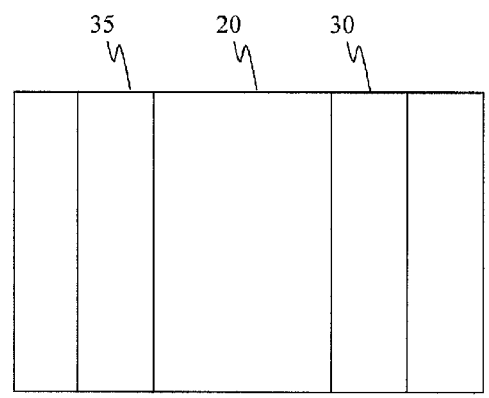
FIG. 3A  FIG. 3B
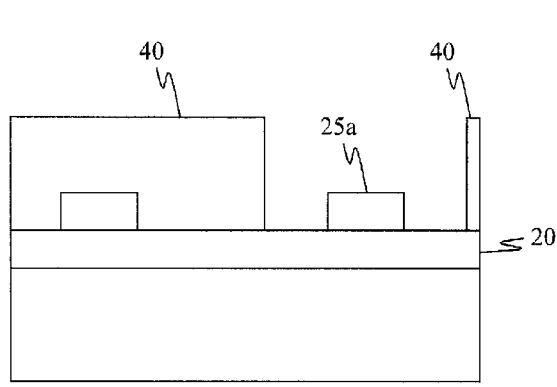
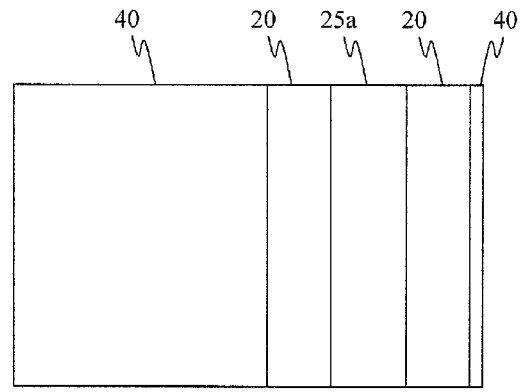
FIG. 4A  FIG. 4B

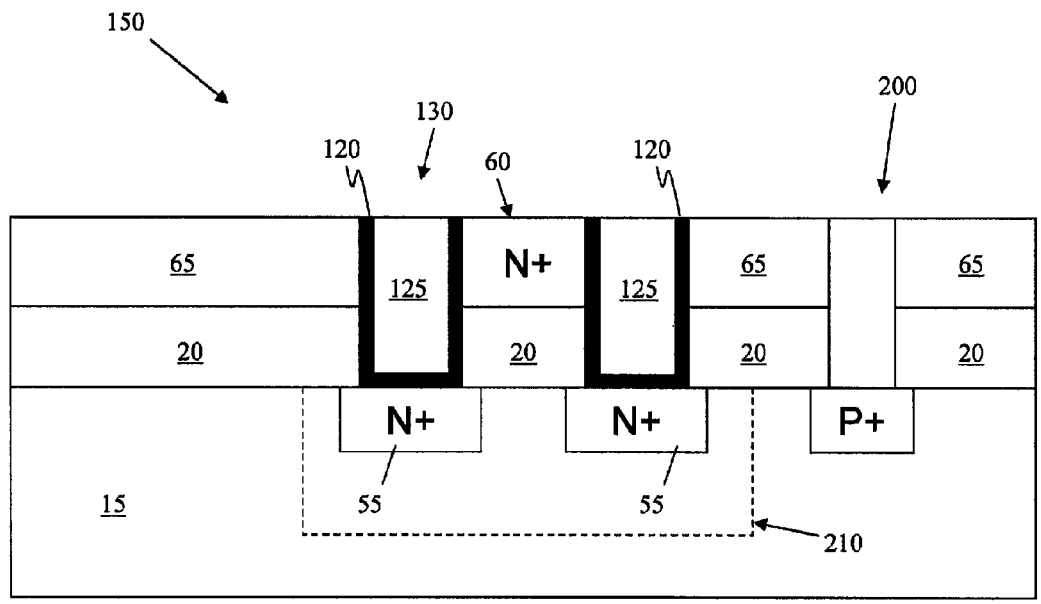
*FIG. 13*
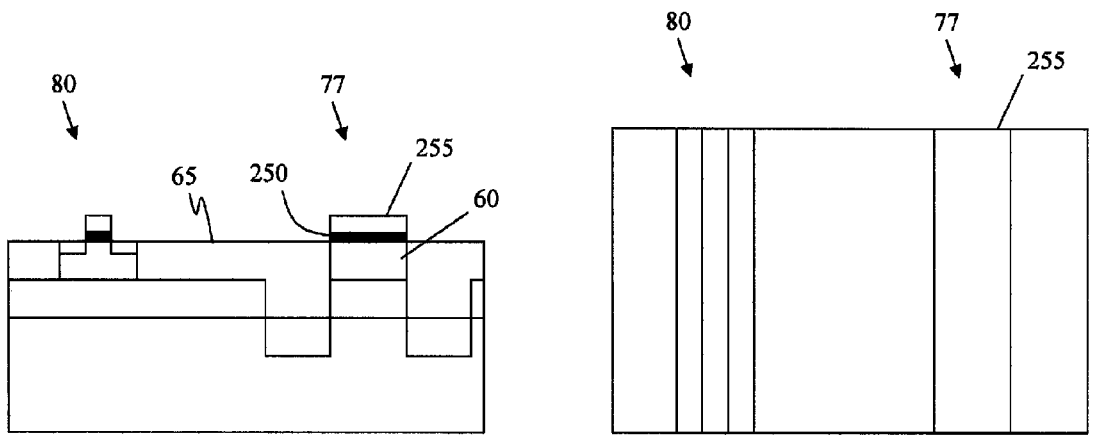
*FIG. 14A*          *FIG. 14B*

HIGH-VOLTAGE SOI MOS DEVICE STRUCTURE AND METHOD OF FABRICATION

FIELD OF THE INVENTION

The invention generally relates to semiconductor devices and, more particularly, to integrating a thick oxide high-voltage metal-oxide-semiconductor (MOS) device into a thin oxide silicon-on-insulator (SOI) technology node and method of manufacture.

BACKGROUND

There is an increasing demand in semiconductor manufacturing to integrate high-voltage devices with high-performance (e.g., low voltage, high speed) devices for system on chip applications. Such integrated devices are useful in, for example, analog and mixed signal applications, especially in automotive areas.

However, in practice, integrating high-voltage and high-performance devices has proven problematic due in part to the differences in dimensional scaling of the respective devices. For example, high-performance devices operating at about 1 v to 1.8 v are generally implemented in the most recent (i.e., smallest) technology node, such as the current 45 nm and 32 nm nodes. A particular known implementation of high-performance devices is in thin-silicon SOI devices.

On the other hand, high-voltage devices operating in ranges between 1.8 v to over 50 v are typically implemented in older, larger technology nodes, such as the 180 nm node. The larger technology nodes provide better heat dissipation required by the higher operating voltages of the high-voltage devices. For example, high-voltage semiconductor devices are commonly manufactured using thick silicon body silicon-on-insulator (SOI) or bulk CMOS technologies. Particularly, high-voltage semiconductor devices may be fabricated using a planar field effect transistors (FET) with thick oxide, or with N or P channel drain-extended metal-oxide-semiconductor (DEMOS) transistor devices, such as lateral diffused MOS (LDMOS) devices.

When constrained by the gate oxide processes in use today, there are significant processing challenges to having gate oxides on the same die that support both 1.0 v devices and devices that operate at voltages that may exceed 20 v. This is due in part to the fact that a gate oxide layer on a particular die is typically optimized for either a high-performance device or a high-voltage device, but not for both at the same time.

Accordingly, there exists a need in the art to overcome the deficiencies and limitations described hereinabove.

SUMMARY

In a first aspect of the invention, there is a method of forming a semiconductor structure. The method includes forming first source and drain regions of a first device below a buried oxide layer of a silicon-on-insulator (SOI) wafer, and forming a gate of the first device in a layer of semiconductor material above the buried oxide layer the method also includes forming second source and drain regions of a second device in the layer of semiconductor material above the buried oxide layer.

In another aspect of the invention, there is a method of fabricating a semiconductor device. The method includes selectively masking a layer of semiconductor material arranged on a buried oxide layer arranged on a substrate, removing unmasked portions of the layer of semiconductor material to create a first portion of the semiconductor material and a second portion of the semiconductor material, and forming trenches in the buried oxide layer adjacent the first portion of the semiconductor material. The method also includes doping exposed regions of the substrate through the trenches, doping the first portion of the semiconductor material, and doping regions of the second portion of the semiconductor material. The method additionally includes forming a gate dielectric over the second portion of the semiconductor material, and forming a gate over the gate dielectric.

In another aspect of the invention, there is a semiconductor structure including a first device and a second device. The first device includes first source and drain regions formed in a substrate of a silicon on insulator (SOI) structure. The SOI structure comprises a buried oxide layer overlying the substrate and a semiconductor material layer overlying the buried oxide layer. The first structure also includes a first gate oxide formed in a portion of the buried oxide layer, and a first gate formed in a first portion of the semiconductor material layer. The second device includes a second device comprising second source and drain regions formed in a second portion of the semiconductor material layer over the buried oxide layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 1A, 2A, 3A, 4A, 5A, 6A, 7A, 8A, 9A, 10A, 11A, 12A, 13, and 14A show side views of structures and respective processing steps in accordance with aspects of the invention; and FIGS. 1B, 2B, 3B, 4B, 5B, 6B, 7B, 8B, 9B, 10B, 11B, 12B, and 14B show top views corresponding to the structures and respective processing steps of FIGS. 1A-12A and 14A in accordance with aspects of the invention.

DETAILED DESCRIPTION

The invention generally relates to semiconductor devices and, more particularly, to integrating a thick oxide high-voltage MOS device into a thin oxide SOI technology node and method of manufacture. In embodiments, a thick-oxide field effect transistor (FET) is formed using a buried oxide layer of an SOI wafer as the MOS oxide, with the silicon layer above the buried oxide layer being doped heavily as a gate. More specifically, according to aspects of the invention, a high-voltage device is formed in a thin-silicon SOI wafer by using the buried oxide layer as the gate oxide of the high-voltage device. In this manner, a high-voltage device and a high-performance device can be formed on the same SOI wafer.

Figures 1A, 1B:
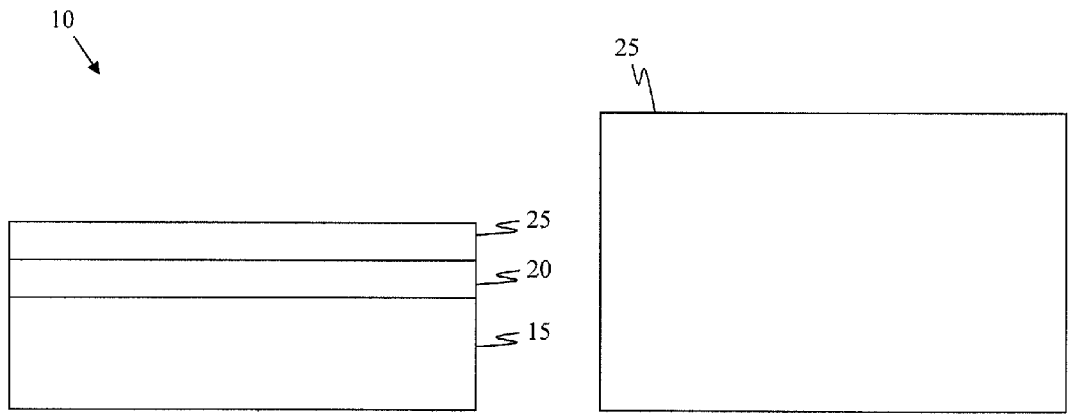

FIGS. 1A-12B show structures and respective processing steps in accordance with aspects of the invention. Specifically, FIG. 1A shows an exemplary SOI wafer 10 employed as an intermediate structure in implementations of the invention. The SOI wafer 10 has a bulk semiconductor substrate 15, which is typically a silicon substrate, a buried oxide (BOX) layer 20 formed on the substrate 15, and a semiconductor layer 25, which is typically a silicon layer, formed on the BOX layer 20. FIG. 1B shows a top view of the SOI wafer 10. The SOI wafer 10 may be fabricated using techniques well know to those skilled in the art. For example, the SOI wafer 10 may be formed by conventional processes including, but not limited to, oxygen implantation (e.g., SIMOX), wafer bonding (e.g., the "SMART CUT" method, which is a registered trademark of S.O.I. TEC Silicon On Insulator Technologies of Bernin, France), etc.

The constituent materials of the SOI wafer 10 may be selected based on the desired end use application of the semiconductor device. For example, the substrate 15 may be composed of any suitable material including, but not limited to, Si, SiGe, SiGeC, SiC, GE alloys, GaAs, InAs, InP, and other III/V or II/VI compound semiconductors. The BOX layer 20 may be composed of, for example, $SiO_2$. Moreover, although the SOI wafer 10 is referred to as "silicon on insulator," the semiconductor layer 25 is not limited to silicon. Instead, the semiconductor layer 25 may be comprised of various semiconductor materials, such as, for example, Si, SiGe, SiC, SiGeC, etc.

The invention is described herein as having a substrate 15 composed of P− type Si and a semiconductor layer 25 comprising P− type Si. However, the invention is not limited to these materials, and any suitable material could be used. For example, N type silicon could be used to form different type devices.

In embodiments, the SOI wafer 10 has a thickness of about 700 μm, with the BOX layer 20 having a thickness of about 0.1 μm (100 nm), and the semiconductor layer 25 having a thickness of about 0.1 μm (100 nm). However, the invention is not limited to these dimensions, and the various portions of the SOI wafer 10 may have any desired thicknesses based upon the intended use of the final semiconductor device.

Figures 2A, 2B:
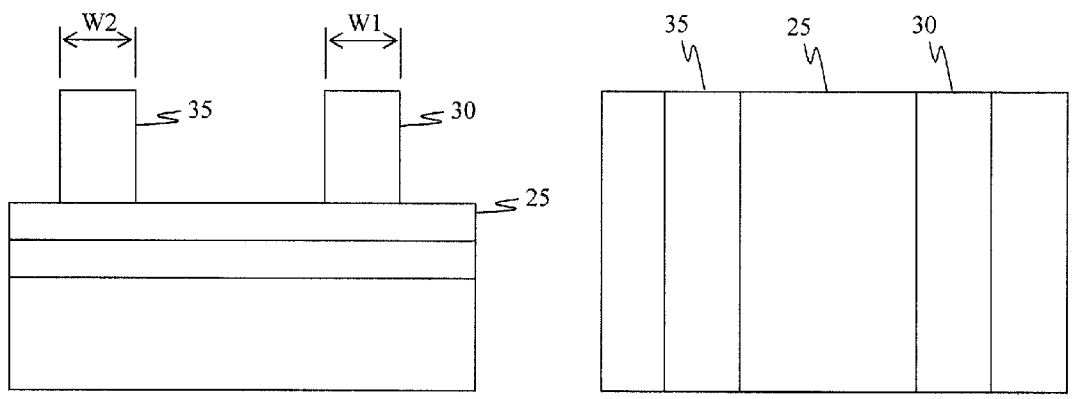

As depicted in FIGS. 2A and 2B, a first photoresist portion 30 and second photoresist portion 35 are formed on the semiconductor layer 25. The first and second photoresist portions 30, 35 may be formed using a conventional patterning process which includes lithography techniques. By way of example, the lithography step may entail applying a photoresist, exposing the photoresist to a pattern of radiation, and developing the pattern utilizing a conventional resist developer to result in the first and second photoresist portions 30, 35.

In embodiments, the width "W1" of the first photoresist portion 30 will correspond to the channel length of the high-voltage device. Accordingly, the width "W1" is preferably greater than or equal to about 0.25 μm, but can be any desired value. Moreover, the width "W2" of the second photoresist portion 35 will correspond to the channel length of the high-performance device. Accordingly, the width "W2" is preferably is about 10 nm to about 100 nm, but can be any desired value.

As depicted in FIGS. 3A and 3B, a portion of the semiconductor layer 25 is removed while the first and second photoresist portions 30, 35 act as a mask. The portion of the semiconductor layer 25 may be removed using any conventional process, such as, for example, reactive-ion etching (RIE), plasma etching, ion beam etching, laser ablation, etc. In embodiments, an RIE process that is selective to the semiconductor material 25 is used to etch the portion of the semiconductor layer 25, thereby exposing a portion of the upper surface of the BOX layer 20. Due to the first and second photoresist portions 30, 35, first semiconductor material portion 25a and second semiconductor material portion 25b remain after the etching.

After the etching of the semiconductor layer 25 as depicted in FIG. 3A, the first and second photoresist portions 30, 35 are removed in a conventional manner. Then, as depicted in FIGS. 4A and 4B, another photoresist layer 40 is applied and patterned to leave portions of the BOX layer 20 and the first semiconductor material portion 25a exposed.

Figure 5A:
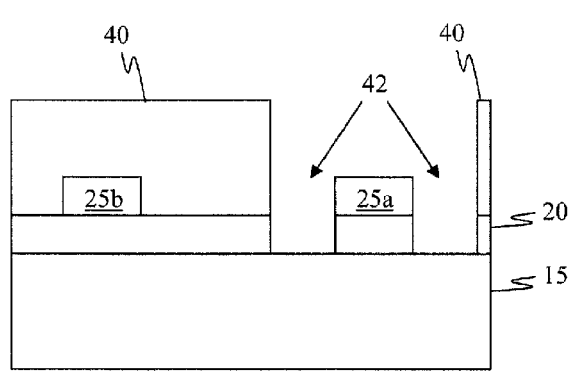
Figure 5B:
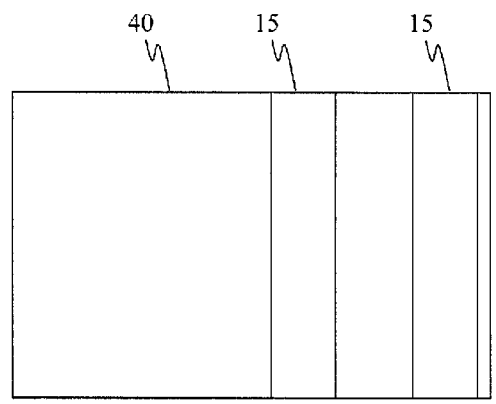

Next, trenches 42 are formed by removing the exposed portions of the BOX layer 20, as shown in FIGS. 5A and 5B. The removal of the material of the BOX layer 20 may be performed using any conventional technique. In embodiments, the exposed portions of the BOX layer 20 are removed using an etch process, such as an RIE process that is selective to the material of the BOX layer 20 (e.g., $SiO_2$) and that stops at the substrate 15. The photoresist 40 is removed in a known manner after the formation of the trenches 42.

Figure 6A:
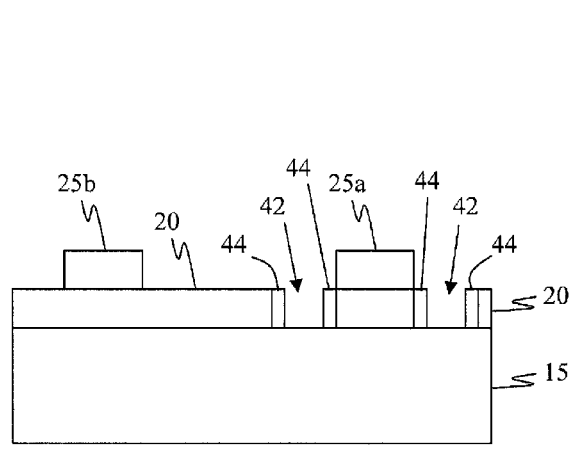
Figure 6B:
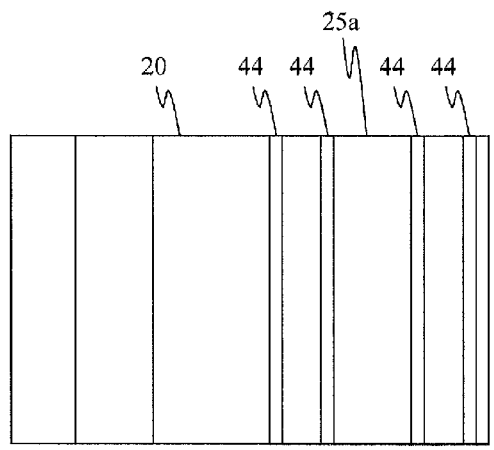

In embodiments, optional sidewall spacers 44 may be formed on the sidewalls of the trenches 42. For example, a layer of oxide material may be conformally deposited over exposed surfaces, including in the trenches 42. Then, a lithography and etching process may be used to remove all of the deposited layer of oxide material except for the sidewall spacers 44, as depicted in FIGS. 6A and 6B. In this manner, the lateral distance of the trenches 42 relative to the first semiconductor material portion 25a can be adjusted to any desired value. As such, the sidewall spacers 44 may be used to tailor alignment of the source/drain regions to the channel of the resultant high-voltage device. In embodiments, the layer of oxide material used to form the sidewall spacers 44 may be composed of the same material as that of the BOX layer 20, e.g., $SiO_2$.

Figure 7A:
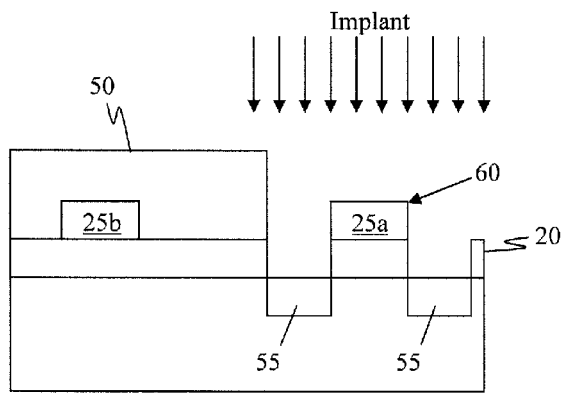
Figure 7B:
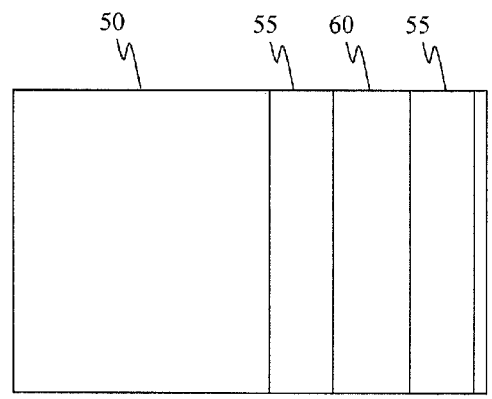

After formation of the trenches 42, and optionally the sidewall spacers 44, a mask 50 is applied over the second semiconductor material portion 25b and associated portion of the BOX layer 20, as depicted in FIGS. 7A and 7B. The first semiconductor material portion 25a and portions of the substrate 15 that are exposed via the trenches 42 are doped using conventional techniques, such as ion-implantation. The doping creates source/drain regions 55 in the substrate 15 below the level of the BOX layer 20.

The doping depicted in FIG. 7A may be performed using any desired species of ion, at any desired concentration, and to any desired depth. In embodiments, a single implantation process is used to implant phosphorous or arsenic ions into the P− type first semiconductor material portion 25a and into exposed portions of the P− type substrate 15 to a depth of about 0.05 μm to about 0.15 μm. The doping creates N+ type source/drain regions 55 in the substrate 15 and changes the first semiconductor material portion 25 from P− type to an N+ type gate 60. Although not shown, optional well doping may also be performed. The mask 50 is removed after formation of the gate 60 and source/drain regions 55.

Figure 8A:
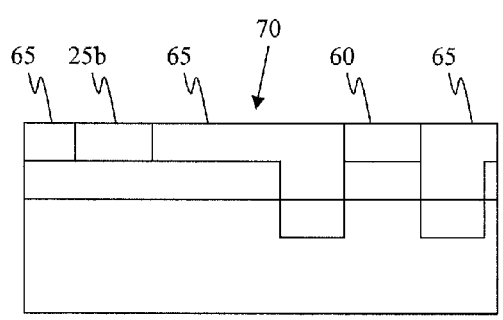
Figure 8B:
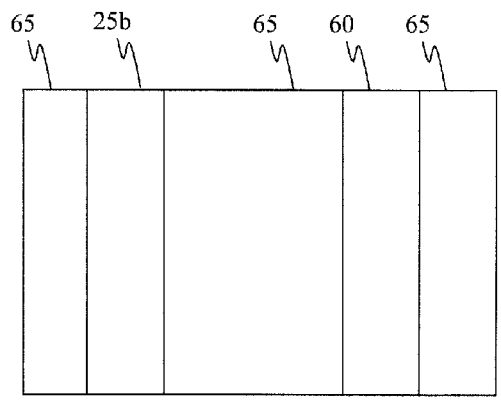

The exposed surfaces of the structure are covered using conventional techniques with a layer of insulating material 65, such as, but not limited to, a high-density plasma (HDP) oxide or tetraethylorthosilicate (TEOS). Then, as depicted in FIGS. 8A and 8B, upper surface of the structure is planarized using, for example, a chemical mechanical polishing (CMP) process. The planarized insulating material 65 material defines a shallow trench isolation (STI) region 70 having a top surface substantially co-planar (e.g., flush) with the top surfaces of the gate 60 and the second semiconductor material portion 25b.

Figure 9A:
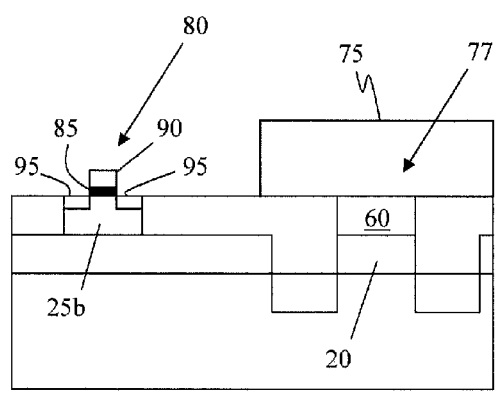
Figure 9B:
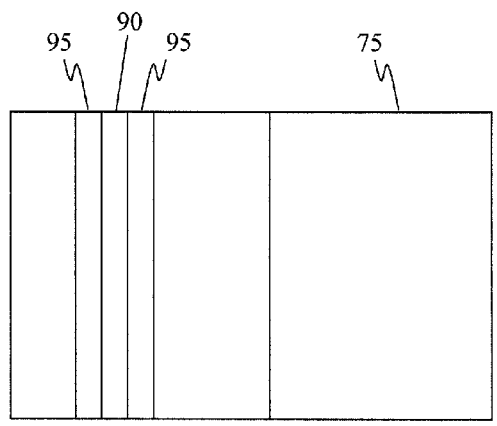

As depicted in FIGS. 9A and 9B, a mask 75 is applied over the gate 60 and source/drain regions 55 of the high-voltage device 77. Standard MOSFET processing steps are used to create the high-performance device 80. In embodiments, the high-performance device 80 is created, for example, by forming a gate dielectric/oxide 85 on the second semiconductor material portion 25b, forming polysilicon gate 90 on the gate dielectric/oxide 85, and forming source drain regions 95 in the second semiconductor material portion 25b, all of which may be formed using conventional MOSFET processing techniques. Optionally, if desired, sidewall spacers may be formed on side of the gate dielectric/oxide 85, and extension and/or HALO implants may be provided in the second semiconductor material portion 25b. However, the invention is not limited to these processing steps, and any suitable processing steps may be used to build the high-performance device 80 on the second semiconductor material portion 25b. The mask 75 is removed after the high-performance device 80 is built.

In embodiments, the thickness of the gate dielectric/oxide 85 of the high-performance device 80 is in a range of about 10 Angstrom to about 20 Angstrom. However, the invention is not limited to this thickness, and other thicknesses can be used. This thickness is significantly less than the thickness of the BOX layer 20, which serves as the gate oxide for the high-voltage device 77. Thus, the high-performance device 80 has a gate oxide dimension tailored for high speed operation, while the high-voltage device 77 has a gate oxide dimension tailored for high-voltage operation. In this manner, implementations of the invention provide for the integration of a high-voltage device into a high-performance SOI process with minimal additional processing steps.

Upon completion of the structure shown in FIGS. 9A and 9B, the front-end-of-line (FEOL) processes for building the high-performance device 80 and high-voltage device 77 are essentially complete. Next, any desired middle-of-line (MOL) and back-end-of-line (BEOL) processes can be performed to complete the structure. For example, silicide contacts may be formed on exposed silicon, such as on the upper surfaces of the gate 60, polysilicon gate 90, and source drain regions 95.

Figure 10A:
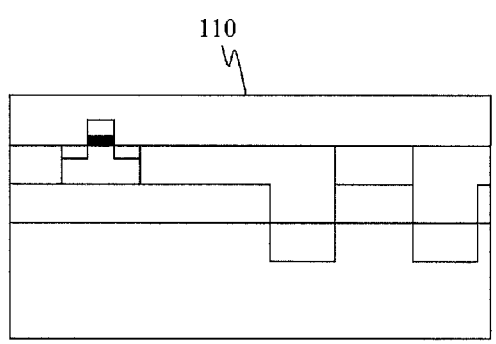
Figure 10B:
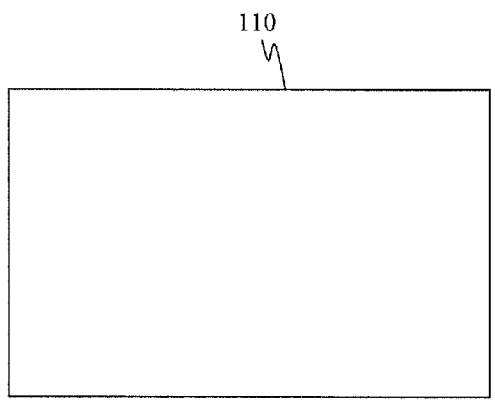

Then, in embodiments, an interlayer dielectric (ILD) layer 110 may be deposited on the exposed surfaces and planarized, as depicted in FIGS. 10A and 10B. The ILD layer 110 may comprise, but is not limited to, a low-k dielectric material, a dielectric such as borophosphosilicate glass (BPSG), high density plasma (HDP) oxide, etc. The ILD layer 110 may be deposited in any suitable manner and may be planarized using CMP.

Figure 11A:
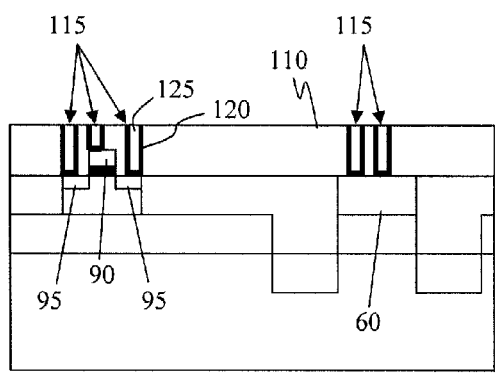
Figure 11B:
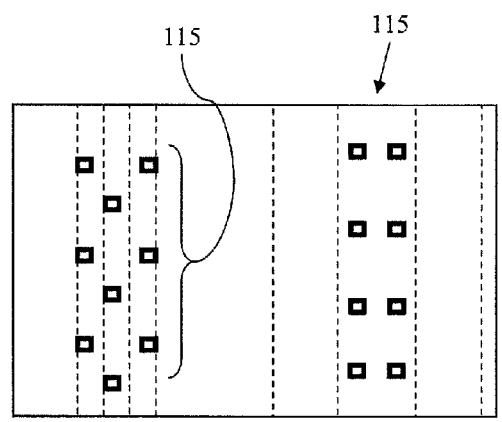

As depicted in FIGS. 11A and 11B, first contacts 115 may be formed in the ILD layer 110. In embodiments, the first contacts 115 comprise a liner 120 and conductive material 125, and are formed by first etching contact holes in the ILD layer 110 down to, or slightly below, the upper surfaces of the gate 60, polysilicon gate 90, and source drain regions 95. If silicide was previously formed on these features, then the contact holes may be etched down to, or slightly below, the upper surface of the silicide. The liner 120 is formed on the exposed surfaces of the contact holes. The liner 120 may comprise, for example, Ta, TaN, Ti, TiN, Ru, RuN, W, WN, or any other material that can serve as a barrier to prevent conductive material from diffusing therethrough. Next, the contact holes are filled with a conductive material 125 such as, for example, Cu, W, Al, Cu alloys, etc.

Figure 12A:
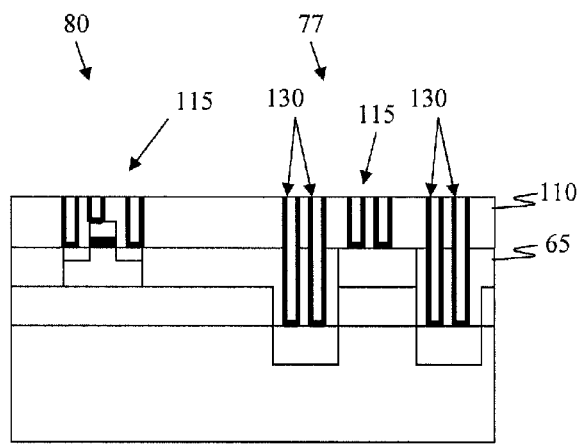
Figure 12B:
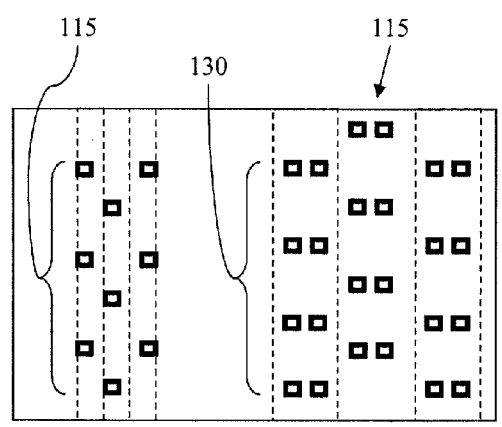

As depicted in FIGS. 12A and 12B, second contacts 130 that extend down to the source/drain regions 55 may also be formed through the ILD layer 110 and the insulator layer 65. The second contacts 130 may be formed in a manner similar to first contacts 115, and may comprise a liner and conductive material, as well.

Any desired number of first contacts 115 and second contacts 130 may be formed in accordance with aspects of the invention. Moreover, as depicted in FIGS. 11B and 12B, a plurality of first contacts 115 and second contacts 130 may be provided along a length of the high-performance device 80 and high-voltage device 77. Moreover, the plurality of first contacts 115 and second contacts 130 may be spatially staggered, as depicted in FIG. 12B.

FIG. 13 shows an embodiment of a high-voltage NFET 150 in accordance with aspects of the invention. The high-voltage NFET 150 comprises source/drain regions 55 formed in the substrate 15 of an SOI wafer below the BOX layer 20. The high-voltage NFET 150 also includes a gate 60 formed on top of the BOX layer 20, such that a portion of the BOX layer 20 acts as the gate oxide for the device. Contacts 130 comprising a liner 120 and conductive material 125 extend through the BOX layer 20 to the source/drain regions 55. Optionally, a substrate contact 200 may be formed to assist in controlling the channel characteristics of the high-voltage NFET 150. Further optionally, a doped well region 210 may be formed in the substrate 15.

FIGS. 14A and 14B depict a further embodiment of the invention that can be used as a FLASH device. Using the structures described in FIGS. 9A and 9B as a starting point, instead of masking the high-voltage device 77 while forming the high-performance device 80, a second gate dielectric 250 and second polysilicon gate 255 may be formed over the gate 60. In this manner, gate 60 constitutes a floating gate in a two-gate high-voltage device. Subsequent MOL and BEOL processing, such as silicide, ILD, and contact formation, may continue after building the structure depicted in FIGS. 14A and 14B.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method of forming a semiconductor structure, comprising:
   forming first source and drain regions of a first device below a buried oxide layer of a silicon-on-insulator (SOI) wafer;
   forming a gate of the first device in a layer of semiconductor material above the buried oxide layer, wherein the buried oxide layer serves as a gate oxide for the first device; and
   forming second source and drain regions of a second device in the layer of semiconductor material above the buried oxide layer.

2. The method of claim 1, wherein the first device comprises a high-voltage device and the second device comprises a high-performance device.

3. The method of claim 1, further comprising forming a gate oxide of the second device on the layer of semiconductor material.

4. The method of claim 3, wherein a thickness of the buried oxide is greater than a thickness of the gate oxide of the second device.

5. The method of claim 3, further comprising forming a gate of the second device on the gate oxide of the second device.

6. The method of claim 5, further comprising:
   forming an upper gate oxide on the gate of the first device; and
   forming an upper gate on the upper gate oxide.

7. The method of claim 5, further comprising:
   forming a dielectric layer over the gate of the first device, the gate of the second device, and the second source and drain regions of the second device; and
   forming contacts in the dielectric layer.

8. A method of forming a semiconductor structure, comprising:
   forming first source and drain regions of a first device below a buried oxide layer of a silicon-on-insulator (SOI) wafer;
   forming a gate of the first device in a layer of semiconductor material above the buried oxide layer; and
   forming second source and drain regions of a second device in the layer of semiconductor material above the buried oxide layer,
   wherein the forming the first source and drain regions comprises:
      forming trenches in the buried oxide layer; and
      implanting ions into a substrate of the SOI wafer through the trenches.

9. The method of claim 8, wherein the forming trenches in the buried oxide layer comprises:
   covering portions of the buried oxide layer with a mask; and
   removing other uncovered portions of the buried oxide layer.

10. The method of claim 8, further comprising forming sidewall spacers in the trenches.

11. A method of fabricating a semiconductor device, comprising:
    selectively masking a layer of semiconductor material arranged on a buried oxide layer arranged on a substrate;
    removing unmasked portions of the layer of semiconductor material to create a first portion of the semiconductor material and a second portion of the semiconductor material;
    forming trenches in the buried oxide layer adjacent the first portion of the semiconductor material;
    doping exposed regions of the substrate through the trenches;
    doping the first portion of the semiconductor material;
    doping regions of the second portion of the semiconductor material;
    forming a gate dielectric over the second portion of the semiconductor material; and
    forming a gate over the gate dielectric.

12. The method of claim 11, further comprising forming sidewall spacers in the trenches.

13. The method of claim 11, further comprising:
    forming another gate dielectric over the first portion of the semiconductor material; and
    forming another gate over the other gate dielectric.

14. The method of claim 11, wherein a thickness of the buried oxide layer is greater than a thickness of the gate dielectric.

15. The method of claim 14, wherein a width of the first portion of the semiconductor material is greater than a width of the second portion of the semiconductor material.

16. A semiconductor structure, comprising:
    a first device including:
    first source and drain regions formed in a substrate of a silicon on insulator (SOI) structure, wherein the SOI structure comprises a buried oxide layer overlying the substrate and a semiconductor material layer overlying the buried oxide layer;
    a first gate oxide formed in a portion of the buried oxide layer; and
    a first gate formed in a first portion of the semiconductor material layer; and
    a second device comprising second source and drain regions formed in a second portion of the semiconductor material layer over the buried oxide layer.

17. The structure of claim 16, wherein the first device comprises a high-voltage device and the second device comprises a low-voltage device.

18. The structure of claim 16, wherein a width of the first portion of the semiconductor material is greater than a width of the second portion of the semiconductor material.

19. The structure of claim 16, wherein:
    the second device comprises a second gate oxide formed on the second portion of the semiconductor material and a second gate formed on the second gate oxide; and
    a thickness of the first gate oxide is greater than a thickness of the second gate oxide.

20. The structure of claim 19, further comprising:
    a third gate oxide formed on the first gate; and
    a third gate formed on the third gate oxide.

* * * * *